US009397180B1

(12) United States Patent
Yang et al.

(10) Patent No.: US 9,397,180 B1
(45) Date of Patent: Jul. 19, 2016

(54) LOW RESISTANCE SINKER CONTACT

(71) Applicant: Texas Instruments Incorporated, Dallas, TX (US)

(72) Inventors: Hong Yang, Richardson, TX (US); Seetharaman Sridhar, Richardson, TX (US); Yufei Xiong, Chengdu (CN); Yunlong Liu, Chengdu (CN); Zachary K. Lee, Fremont, CA (US); Peng Hu, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/695,290

(22) Filed: Apr. 24, 2015

(51) Int. Cl.
*H01L 21/00* (2006.01)
*H01L 29/45* (2006.01)
*H01L 29/417* (2006.01)
*H01L 29/78* (2006.01)
*H01L 29/732* (2006.01)
*H01L 29/739* (2006.01)
*H01L 21/311* (2006.01)
*H01L 21/768* (2006.01)
*H01L 21/288* (2006.01)
*H01L 21/3215* (2006.01)
*H01L 21/265* (2006.01)

(52) U.S. Cl.
CPC .............. *H01L 29/45* (2013.01); *H01L 21/265* (2013.01); *H01L 21/2885* (2013.01); *H01L 21/31111* (2013.01); *H01L 21/3215* (2013.01); *H01L 21/76802* (2013.01); *H01L 21/76843* (2013.01); *H01L 21/76877* (2013.01); *H01L 29/41708* (2013.01); *H01L 29/41741* (2013.01); *H01L 29/41766* (2013.01); *H01L 29/732* (2013.01); *H01L 29/7395* (2013.01); *H01L 29/7809* (2013.01)

(58) Field of Classification Search
CPC .................... H01L 21/3043; H01L 21/76205; H01L 21/76877
USPC ............................ 438/41, 270, 427, 589, 700
See application file for complete search history.

(56) References Cited

U.S. PATENT DOCUMENTS

2003/0008441 A1* 1/2003 Kalnitsky ................ H01L 21/84
438/186

* cited by examiner

*Primary Examiner* — Tan N Tran
(74) *Attorney, Agent, or Firm* — Jacqueline J. Garner; Frank D. Cimino

(57) ABSTRACT

An semiconductor device with a low resistance sinker contact wherein the low resistance sinker contact is etched through a first doped layer and is etched into a second doped layer and wherein the first doped layer overlies the second doped layer and wherein the second doped layer is more heavily doped that the first doped layer and wherein the low resistance sinker contact is filled with a metallic material. A method for forming a semiconductor device with a low resistance sinker contact wherein the low resistance sinker contact is etched through a first doped layer and is etched into a second doped layer and wherein the first doped layer overlies the second doped layer and wherein the second doped layer is more heavily doped that the first doped layer and wherein the low resistance sinker contact is filled with a metallic material.

11 Claims, 9 Drawing Sheets

LOW RESISTANCE SINKER CONTACT

FIELD OF THE INVENTION

This invention relates to the field of semiconductor devices. More particularly, this invention relates to low resistance sinker contacts in semiconductor devices.

BACKGROUND OF THE INVENTION

High power transistors frequently occupy a major portion of the chip area in a high power integrated circuit. Vertical high power devices occupy much less area than horizontal high power devices but require contacts to carry current from the buried drain or buried collector. Typically a sinker contact is formed by implanting dopant at a series of different energies to form a highly doped diffusion column from the surface of the substrate down to the buried drain or buried collector. Even with the sinker contact diffusion when high current flows through the diffusion a significant voltage drop may occur limiting the performance of the vertical high power transistors.

Some devices in integrated circuits require low contact resistance for improved performance. Typically to reduce contact resistance the diffusion area is increased and multiple contacts are formed to the diffusion. This increases area of the integrated circuit and may also increase diffusion capacitance which may reduce circuit performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device with a low resistance sinker contact wherein the low resistance sinker contact is etched through a first doped layer and is etched into a second doped layer and wherein the first doped layer overlies the second doped layer and wherein the second doped layer is more heavily doped that the first doped layer and wherein the low resistance sinker contact is filled with a metallic material. A method for forming a semiconductor device with a low resistance sinker contact wherein the low resistance sinker contact is etched through a first doped layer and is etched into a second doped layer and wherein the first doped layer overlies the second doped layer and wherein the second doped layer is more heavily doped that the first doped layer and wherein the low resistance sinker contact is filled with a metallic material.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
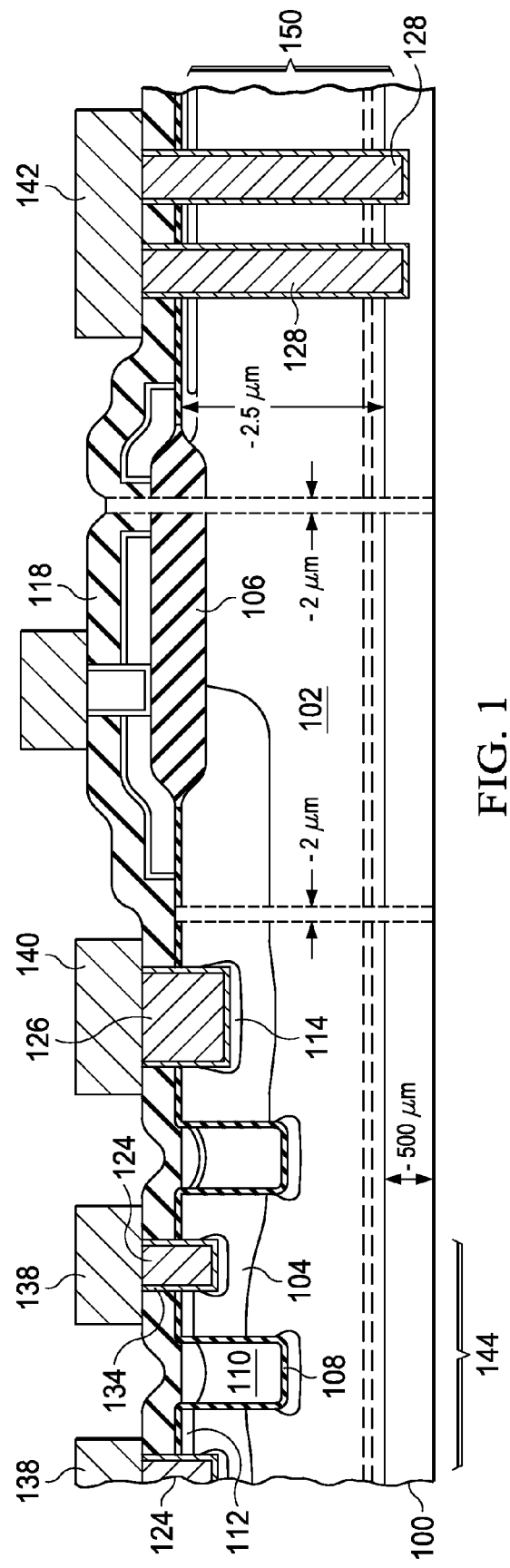
FIG. 1 is a cross section of an example semiconductor device containing a low resistance sinker contact.

An example of a semiconductor device with a low resistance sinker contact is shown in FIG. 1. The substrate includes an n-type epitaxial layer 102 on a low resistance heavily n+ doped layer 100. Low resistance sinker contacts 128 extend through the n-type epitaxial layer 102 and into the low resistance heavily n+ doped layer 100. The low resistance sinker contacts are 148 filled with a metallic material 128 such as CVD-W or electroplated copper. The low resistance sinker contacts 128 form electrical contact along the portion of walls and the bottom of the sinker contact 150 that extend through to the substrate 102 and into the buried n+ diffusion 100. The low resistance sinker contacts 128 may be round holes or rectangular trenches.

To illustrate the benefits of the low resistance sinker contact 128, a vertical high power NMOS transistor 144 is used. Other transistors such as a vertical high power PMOS transistor or discrete high power bipolar transistors may also be used. In addition the transistors may be discrete devices or part of an integrated circuit. The source of the vertical high power NMOS transistor 144 is n-type diffusion 112. The body of the vertical high power NMOS transistor 144 is a p-well 104. The drain of the vertical high power NMOS transistor 144 is the n-type substrate 102 plus buried n+ layer 100. Gate dielectric 108 isolates the transistor gate 110, from the source 112, drain 102, and body 104 of the vertical high power NMOS transistor 144. A dielectric isolation 106 such as LOCOS (local oxidation of silicon) or STI (shallow trench isolation) electrically isolates the vertical high power NMOS transistor 144 from the low resistance sinker contact 148.

The body 104 is connected by contact plug 126 to interconnect lead 140. The contact plug 126 is connected to the p-type body 104 through a heavily doped p-type diffusion 114. The n-type source diffusions 112 are connected by contact plugs 124 to interconnect leads 138. The contact holes are etched through pre-metal dielectric (PMD) layer 118 and typically filled with a barrier material 134 such as titanium plus titanium nitride and then filled with a metallic material such as CVD-W (chemical vapor deposited tungsten).

When voltage is applied to the transistor gate 110, a channel forms in the body 104 under the gate dielectric 108 and high current flows through the vertical high power NMOS transistor 144 and into the low resistance buried n+ layer 100.

Since I=V/R (current=voltage/resistance) when contact resistance is high the current is reduced. The low resistance sinker contacts 128 extend from the first layer of interconnect 142 through the PMD layer 118, through the lightly doped, high resistance n-type substrate 102, and into the highly doped, low resistance buried n+ layer 100. This significantly reduces the contact resistance in series with the high power transistor 144. The lowered resistance results in a significant increase in the high power (high current) performance of the high power transistor 144.

Figure 2:
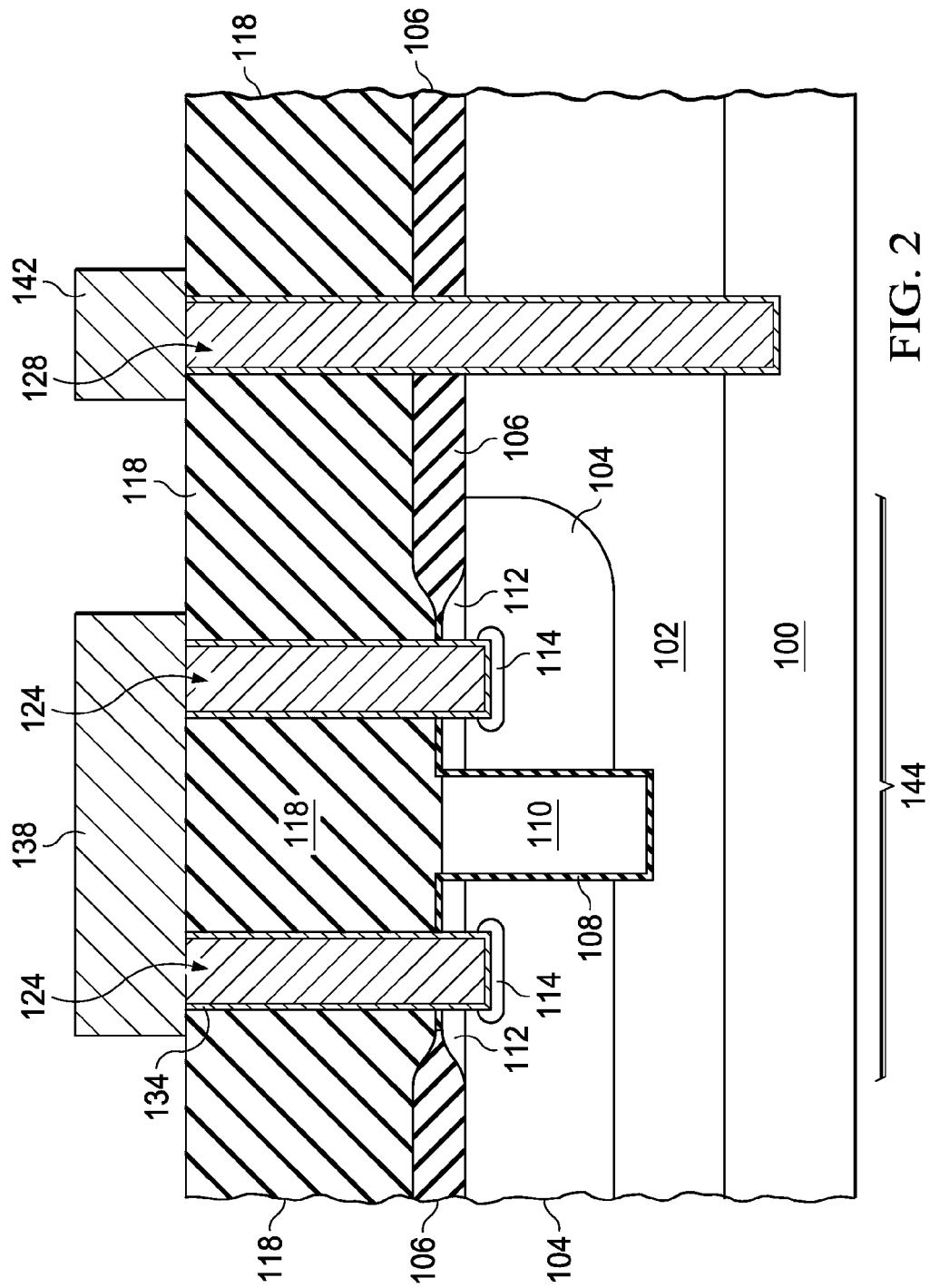
FIG. 2 is a cross section of an example simplified semiconductor device containing a low resistance sinker contact.

A simplified version of the semiconductor device shown in FIG. 1 is shown in FIG. 2. The corresponding structures in FIG. 1 and FIG. 2 are labeled with the same numbers. Source/body contacts 124 are formed by etching the source contacts through the n+ source diffusion 112 and into the p-type body 104. In this version the source 112 is shorted to the body 104 of the vertical NMOS transistor 144 to enable the area of the semiconductor device to be reduced. Optional p+ diffusions 114 may be formed under the source/body contacts 124. This reduced area transistor is unidirectional. The sinker contact 128 is always the drain terminal for this transistor.

Figure 3:
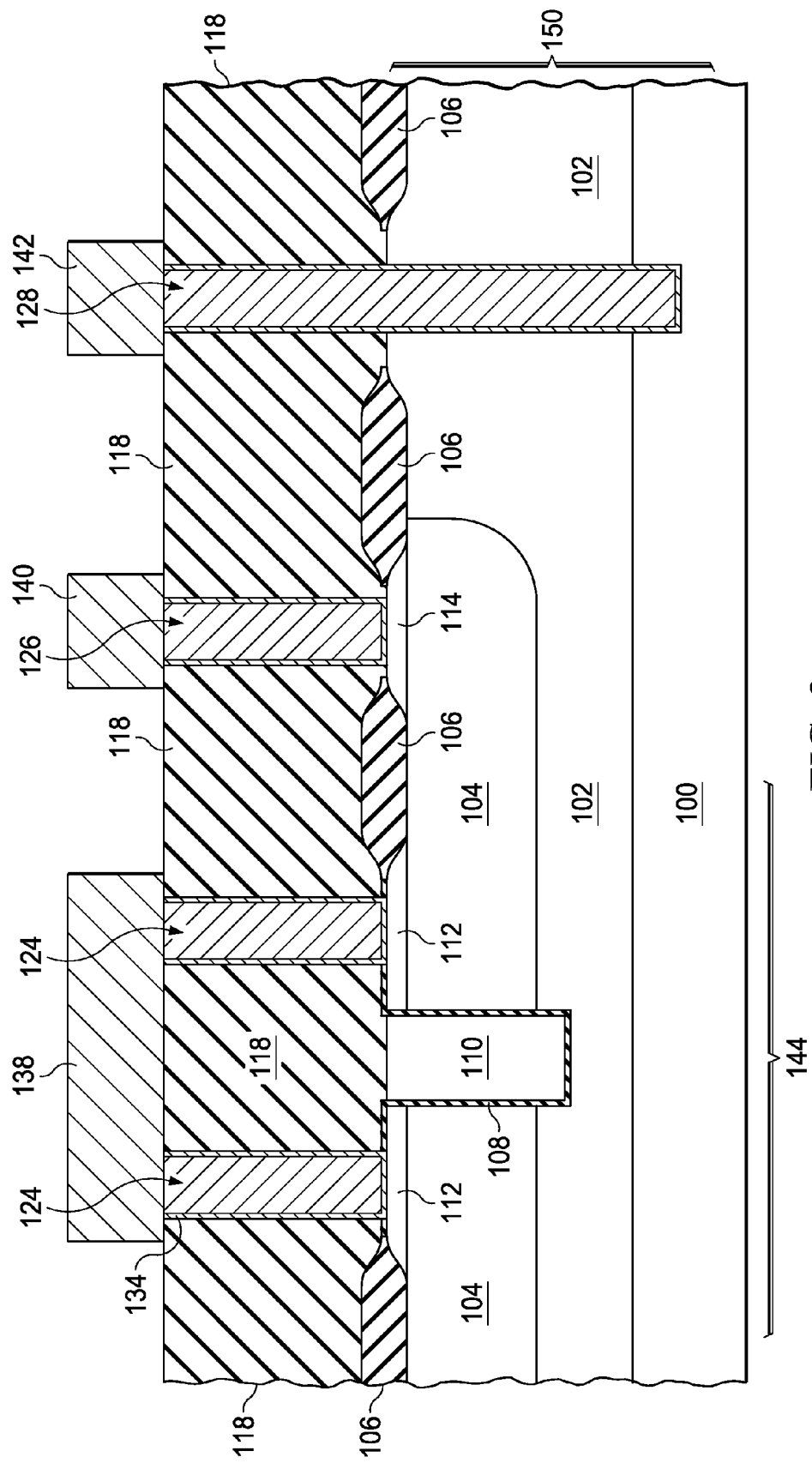
FIG. 3 is a cross section of an example simplified semiconductor device containing a low resistance sinker contact.

Another simplified version of the semiconductor device in FIG. 1 is shown in FIG. 3. In this version the p-well contact 126 is separated from the source contact 124. The source contact 124 is only etched to the N+ source diffusion 112 and not into the p-well 104 as in FIG. 2. This version of the transistor is bidirectional. The low resistance sinker contact 128 may be used as either a low resistance drain contact or a low resistance source contact. When Vcc is connected to diffusion 112 and Vdd is connected to the low resistance sinker contact 128 then diffusion 112 is the source and the low resistance sinker contact is the drain of the vertical NMOS transistor 144. When Vcc is connected to the low resistance sinker contact 128 and Vdd is connected to diffusion 112, then the low resistance sinker is connected to the source and diffusion 112 is the drain of the vertical NMOS transistor 144.

The major steps in the fabrication of the semiconductor device with a low resistance sinker contact shown in FIG. 3 is illustrated in FIGS. 4A through 4D.

Figure 4A:
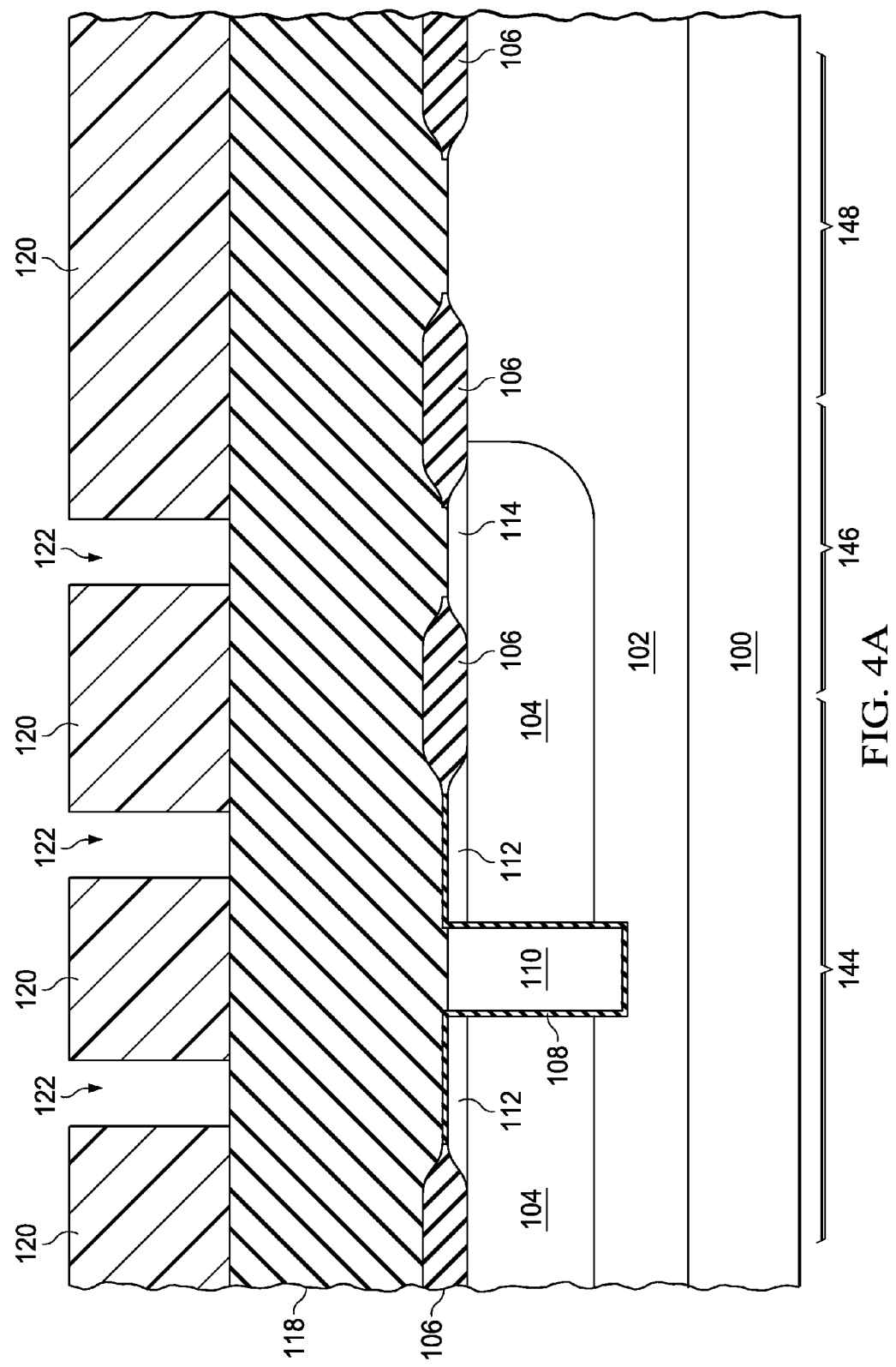
FIG. 4A through FIG. 4D are cross sections of the semiconductor device of FIG. 3 depicted in successive stages of fabrication.

FIG. 4A shows a semiconductor device with a vertical high power transistor 144, a body contact region 146, and a sinker contact region 148. A contact pattern 120 is formed on the PMD (pre-metal dielectric) layer 118 with openings 122 where contact openings are to be etched to the source of the vertical NMOS transistor 144 and to the p-well body contact 146.

Figure 4B:
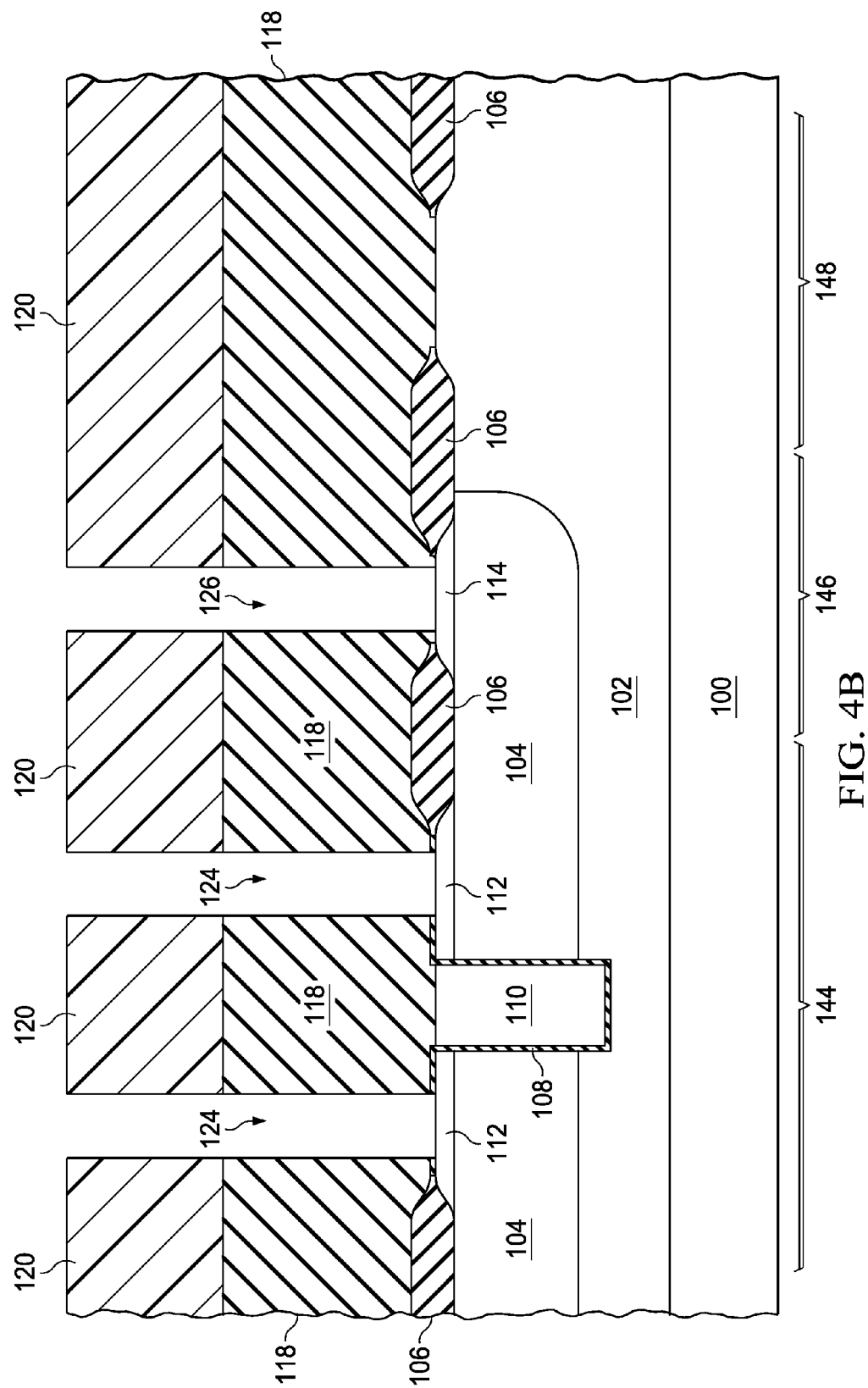

FIG. 4B shows the semiconductor device after the source contact openings 124 and body contact opening 126 are etched through the PMD layer 118. Typically a contact is also etched to the drain region 148 and filled with a metallic material such as CVD-W to form contact plugs to the source 112, the body 114, and the drain 102. Since the typical drain contact forms electrical contact to the drain only through the bottom of a drain contact opening, the contact area is small and the drain contact resistance is high.

Figure 4C:
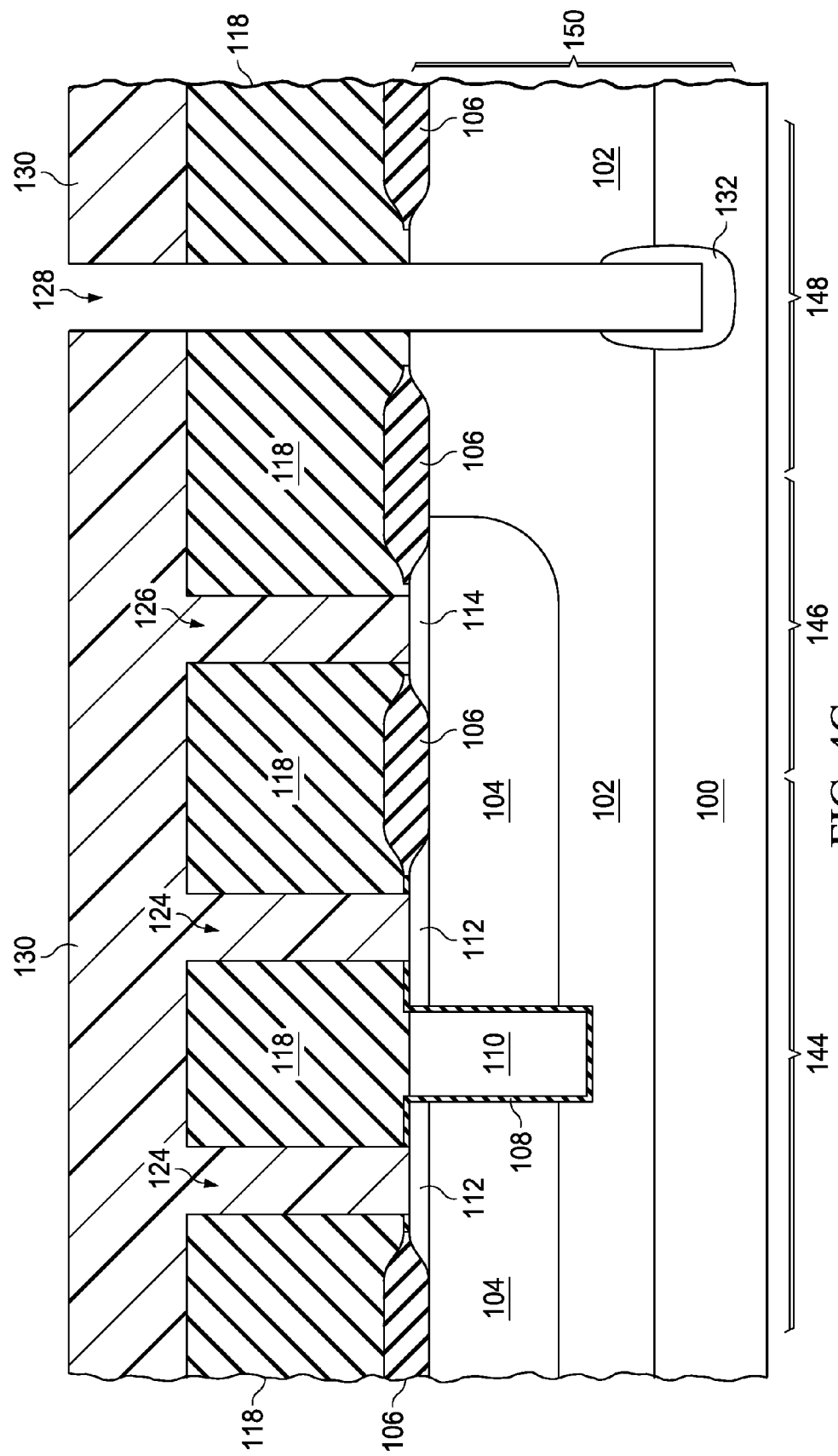

In FIG. 4C, a sinker contact pattern 130 is formed on the semiconductor device with an opening where the low resistance sinker contact 128 is to be etched. The sinker contact 128 is etched through the PMD layer 118, through the n-type epi layer 102, and into the heavily doped buried n+ layer 100. The depth of the low resistance sinker contact 128 depends upon the thicknesses of the layers forming the vertical high power device. The low resistance sinker contact 148 depth may be less than a half micron or 5 microns or more. Instead of having a contact area that is only the bottom of the contact, the low resistance sinker contact area includes the bottom of the low resistance sinker contact and the sidewalls of the low resistance sinker contact 150 that extend through the n-type epi layer 102 and into the heavily doped buried n+ layer 100. The contact resistance is reduced in direct proportion to the increase in contact area. In an example semiconductor device with a vertical high power NMOS transistor the width of the low resistance sinker contact 128 is 0.6 um and the depth is about 2.5 microns.

As shown in FIG. 3 the low resistance sinker contact 126 is etched into the substrate 102 in a region between isolation geometries 106. As is illustrated in FIG. 2 the low resistance sinker contact 126 may be etched through the PMD 118, through the isolation dielectric 106 and into the substrate 102. In addition, if desired the low resistance sinker contact pattern 130 and etch may be performed before the contact pattern 120 and etch.

As shown in FIG. 4C an optional implant with the same doping type as the substrate (n-type for this example) may be performed to form a highly doped diffusion 132 along the sidewalls and bottom of the low resistance sinker contact 128 to additionally reduce the contact resistance.

Figure 4D:
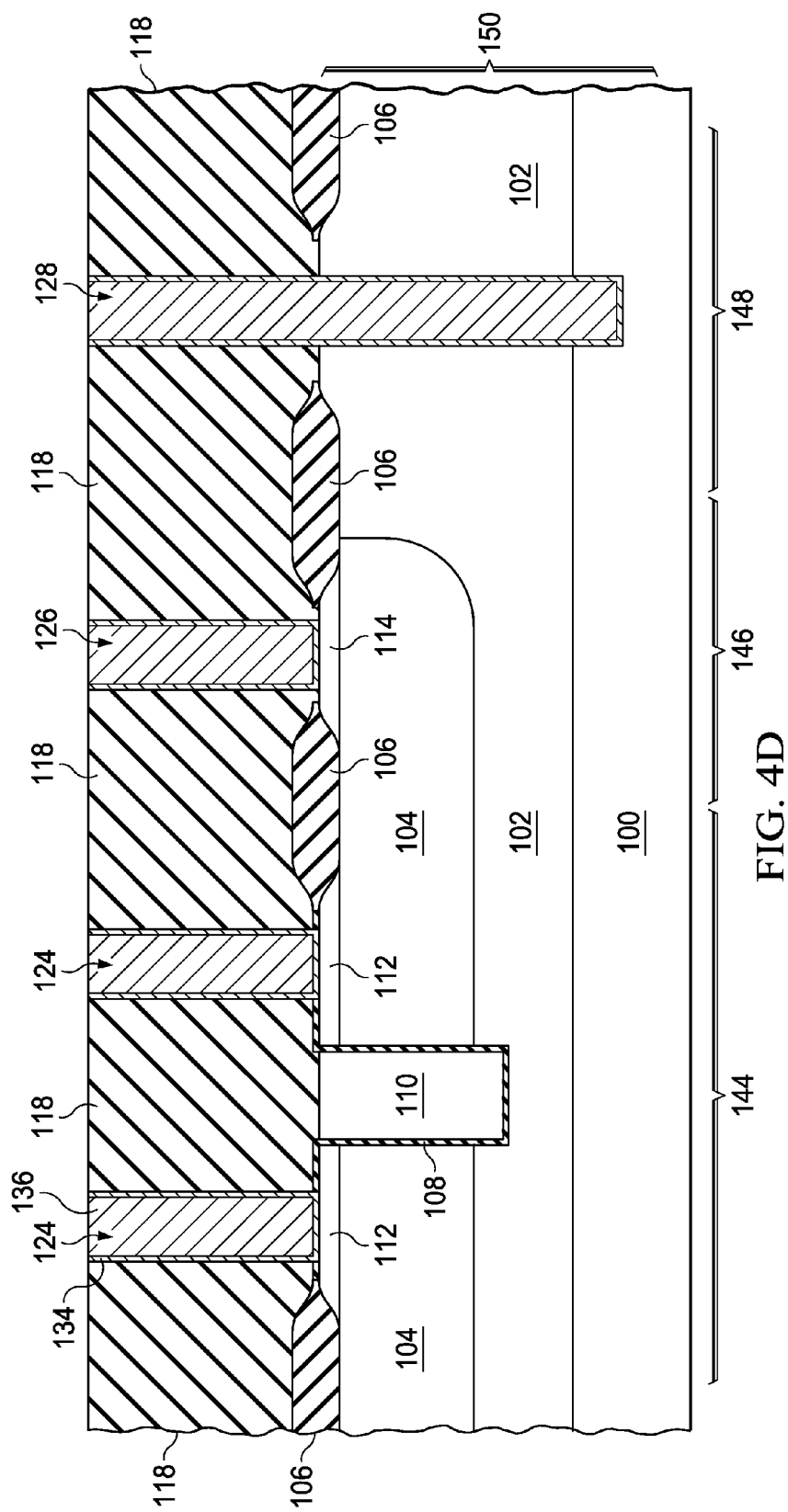

Referring now to FIG. 4D, the sinker contact pattern 130 is removed and contacts 124 and 126 and low resistance sinker contact 128 are filled with a metallic material such as CVD-W or electroplated copper. The width of the low resistance sinker contact may be the contact width design rule of the technology or may be larger. If the sinker contact width is larger than the design rule, then the thickness of the CVD-W is increased to completely fill the low resistance sinker contact 128. In an example semiconductor device with a vertical high power NMOS transistor, the low resistance sinker contact is a trench with a width of 0.6 um. A barrier layer 134 typically titanium plus titanium nitride is first deposited using a PVD (physical vapor deposition) technique such as sputtering before filling the contact openings with about 600 nm of CVD-W. CVD-W overfill is then removed by etch back or by CMP (chemical mechanical polish). The low resistance sinker contact 128 provides a low resistance path between the low resistance buried n+ layer 100 and the interconnect 142 (FIG. 2). The voltage drop through this low resistance metallic sinker contact is significantly less than the voltage drop that occurs in typical semiconductor devices with a surface drain contact.

Additional processing including first interconnect deposition, patterning, and etch is performed to form the first interconnection geometries 138, 140, and 142 shown in FIG. 3. Additional dielectric layers and metal layers may also be added to complete the semiconductor device.

Figure 5:
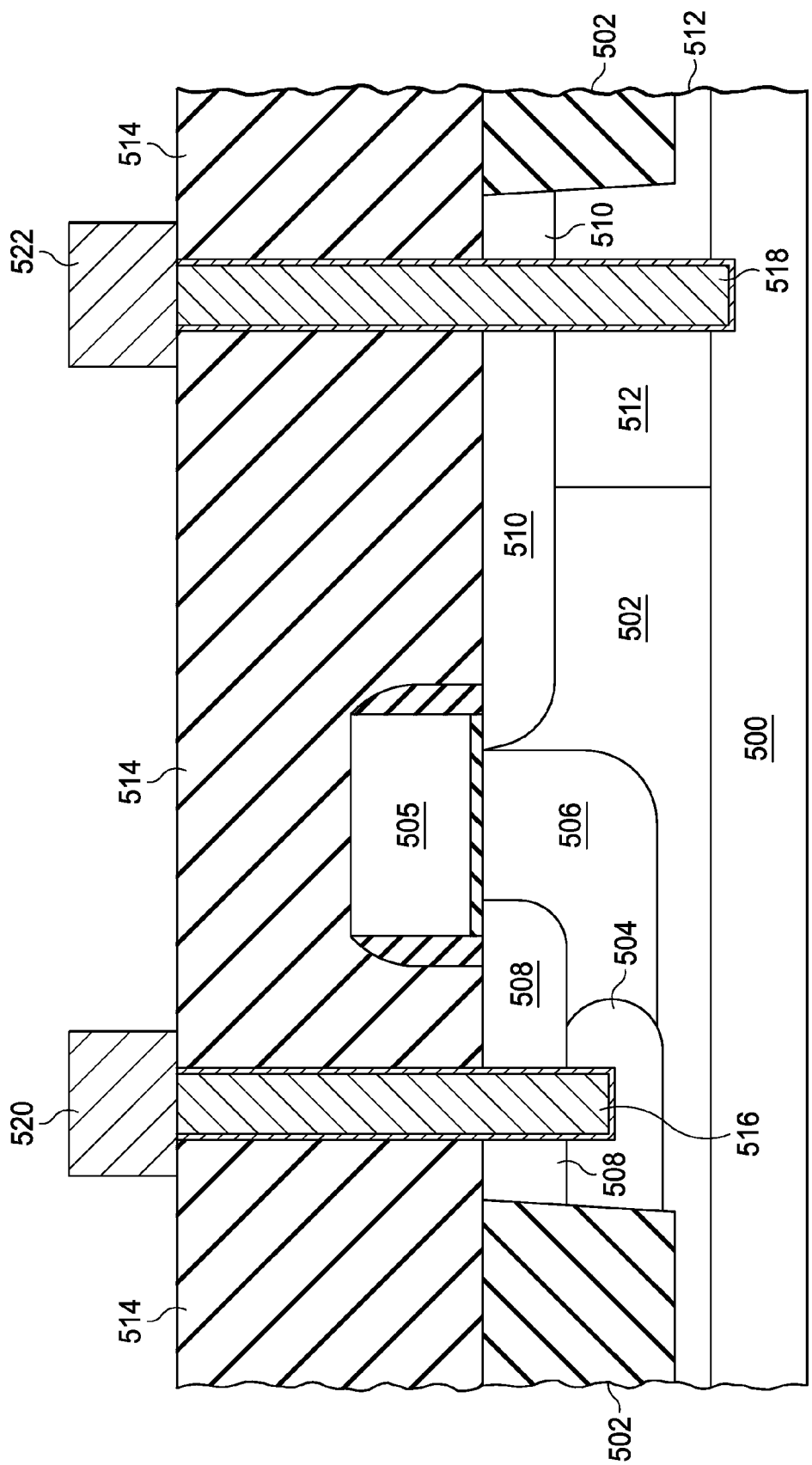
FIG. 5 is a cross section of a high power NMOS transistor with a low resistance sinker contact to the drain.

A planar high power NMOS transistor with a low resistance sinker contact 518 is shown in FIG. 5. Typically, the backside of the wafer under the heavily doped n-type layer 500 is the drain. In some circuits this presents the problem of providing power to both the topside and bottomside of the semiconductor device/integrated circuit as well as sinking the heat from the high power circuit. As shown in FIG. 5 low resistance sinker contacts 518 may be used to electrically connect the heavily doped n-type layer 500 to the power supply using topside only contacts. The source of the high power planar NMOS transistor is a heavily doped n-type diffusion 508. The body 506 of the transistor is shorted to the source 508 through a heavily doped p-type diffusion 504 and contact 516. When a voltage is applied to the gate 505, a channel forms in the body 506 under the gate 505 and current flows through the n-type drain diffusion 510, the n-doped sinker diffusion 512, and the heavily doped n-type layer 500. The low resistance sinker contact 518 connects the heavily doped n-type layer 500 and the n-doped sinker diffusion 512 to topside interconnect 522. The low resistance sinker contact 518 enables both Vcc and Vdd to be supplied from the topside of this semiconductor device.

The topside planar high power MOS transistor with a low resistance sinker contact is illustrated with a unidirectional NMOS transistor with a source/body shorted contact. The topside planar high power MOS transistor with a low resistance sinker contact could equally well be illustrated with a bidirectional NMOS high power transistor or with a unidirectional or bidirectional PMOS high power transistor.

Figure 6:
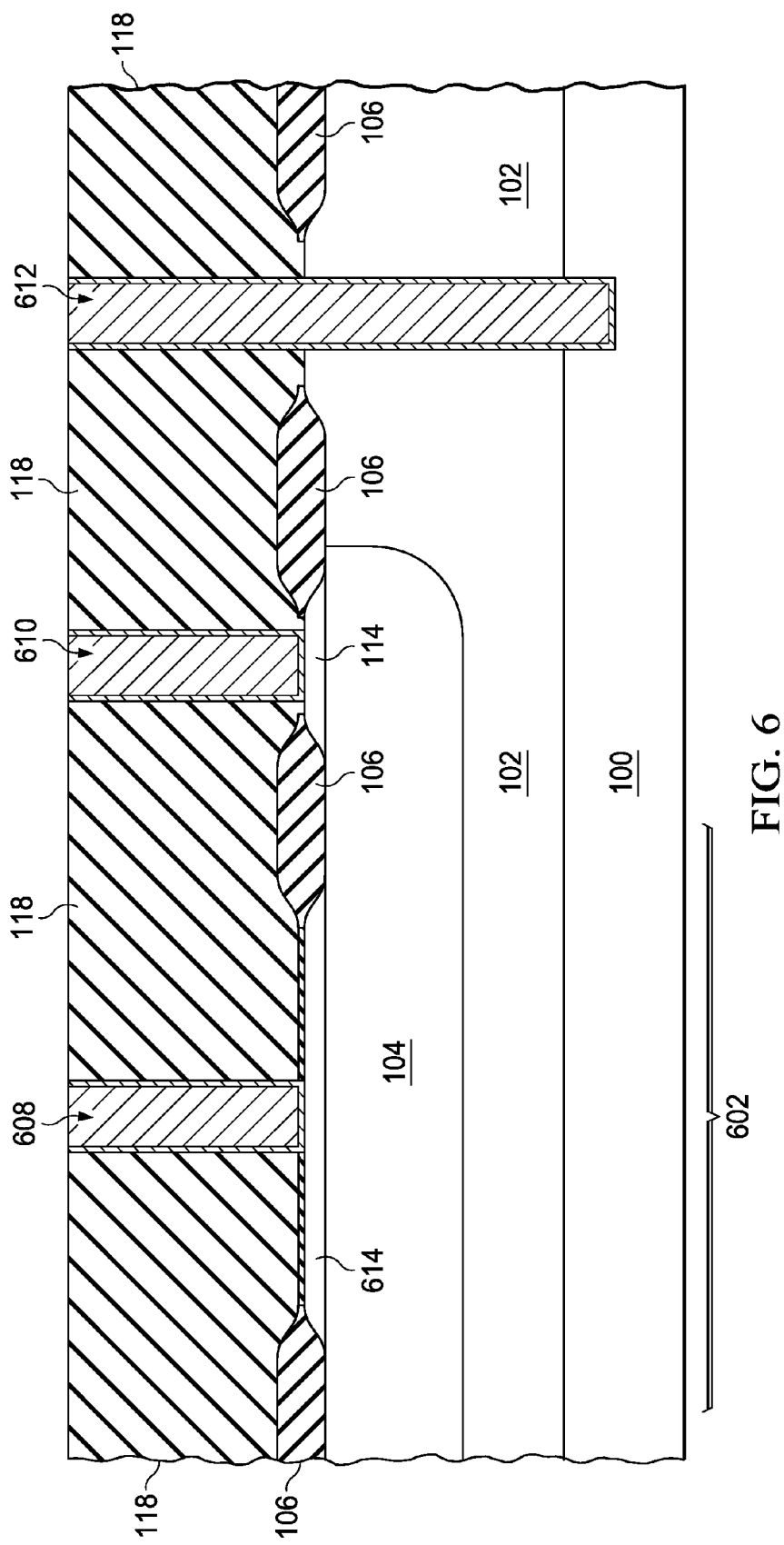
FIG. 6 is a cross section of a high power NPN bipolar transistor with a low resistance sinker contact to the collector.

A high power vertical NPN bipolar transistor 602 with a low resistance sinker contact 612 is illustrated in FIG. 6. The high power vertical NPN bipolar transistor 602 consists of a heavily doped n-type emitter diffusion 614, a lightly doped p-type base diffusion 104, and an n-type collector diffusion comprised of an n-type epi layer 102 on top of a heavily doped n+ substrate 100. The heavily doped collector provides low resistance for handling high current. The sinker contact 612 provides a low resistance path through the lightly doped n-type epi layer 102 significantly improving the performance of the high power vertical NPN bipolar transistor 602. Contact plug 608 provides electrical connection through PMD layer 118 to the emitter 614. Contact plug 610 contacts heavily doped p-type diffusion 114 which provides electrical contact to the base 104.

Although the low resistance sinker contact is illustrated using high power semiconductor devices, the low resistance sinker contact may be formed on any type of semiconductor device/integrated circuit that would benefit from a low resistance contact in a small area. For example, the usual method of reducing contact resistance is to form multiple contacts or an array of contacts to the diffusion. Sometimes the area of the diffusion is increased to accommodate multiple contacts. One low resistance sinker contact can provide lower resistance than an array of multiple typical contacts. In addition to lower contact resistance the sinker contact enables a diffusion with smaller area to be formed which also benefits circuit performance by reducing diode capacitance.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a semiconductor device, comprising the steps:
   providing substrate with a transistor covered by a pre-metal dielectric layer;
   forming a contact pattern on the pre-metal dielectric layer with openings where contacts are to be formed;
   etching contact openings through the pre-metal dielectric and forming a contact opening to a first node of the transistor;
   removing the contact pattern;
   forming a sinker contact pattern on the pre-metal dielectric layer with an opening where the low resistance sinker contact is to be formed;
   etching a sinker contact through the pre-metal dielectric and etching the sinker contact through a first doped layer and into a second doped layer wherein the first doped layer and the second doped layer have the same doping type and wherein the second doped layer is more heavily doped than the first doped layer and wherein the first doped layer and the second doped layer form a second node of the transistor;
   removing the sinker contact pattern;
   depositing a barrier layer into the contact openings and into the low resistance sinker contact opening;
   depositing a metallic material into and filling the contact openings and into and filling the low resistance sinker contact opening; and
   removing metallic material overfill to form contact plugs and to form a low resistance sinker contact plug.

2. The method of claim 1, further including implanting dopant into the sidewalls and into the bottom of the low resistance sinker contact prior to removing the sinker contact pattern and forming a low resistance highly doped diffusion on the sidewalls and bottom of the low resistance sinker contact.

3. The method of claim 1, wherein the transistor is a high power MOS transistor and the low resistance sinker contact is coupled between interconnect and the highly doped buried layer under the high power MOS transistor.

4. The method of claim 3, wherein the heavily doped buried layer is the source of a bidirectional high power MOS transistor.

5. The method of claim 3, wherein the heavily doped buried layer is the drain of a unidirectional high power MOS transistor.

6. The method of claim 3, wherein the heavily doped buried layer is the collector of a high power vertical bipolar transistor.

7. The method of claim 1, wherein the barrier layer is titanium plus titanium nitride and where the metallic material is CVD-W.

8. The method of claim 1, wherein the barrier layer is tantalum plus a copper seed and the metallic material is electroplated copper.

9. The method of claim 1, wherein the low resistance sinker contact is etched into the substrate between 0.5 um and 5 um.

10. The method of claim 1 wherein the steps of forming a sinker contact pattern, etching a sinker contact, and removing the sinker contact pattern are performed prior to the step of forming a contact pattern.

11. The method of claim 1, wherein the step of etching the sinker contact further includes etching the sinker contact through the isolation dielectric.

\* \* \* \* \*